(12) United States Patent
Hozumi et al.

(10) Patent No.: US 11,297,744 B2
(45) Date of Patent: Apr. 5, 2022

(54) POWER CONVERSION DEVICE

(71) Applicant: Mitsubishi Electric Corporation, Tokyo (JP)

(72) Inventors: Kota Hozumi, Tokyo (JP); Masahiro Noguchi, Tokyo (JP)

(73) Assignee: Mitsubishi Electric Corporation, Tokyo (JP)

( * ) Notice: Subject to any disclaimer, the term of this patent is extended or adjusted under 35 U.S.C. 154(b) by 0 days.

(21) Appl. No.: 16/993,358

(22) Filed: Aug. 14, 2020

(65) Prior Publication Data
US 2021/0127530 A1    Apr. 29, 2021

(30) Foreign Application Priority Data
Oct. 28, 2019    (JP) .............................. JP2019-194996

(51) Int. Cl.
*H05K 7/20* (2006.01)
*H01B 7/00* (2006.01)
*H02M 7/00* (2006.01)

(52) U.S. Cl.
CPC ....... *H05K 7/20927* (2013.01); *H01B 7/0045* (2013.01); *H02M 7/003* (2013.01)

(58) Field of Classification Search
None
See application file for complete search history.

(56) References Cited

U.S. PATENT DOCUMENTS

| | | | |
|---|---|---|---|
| 2013/0070502 A1* | 3/2013 | Suzuki | H02M 7/003 363/131 |
| 2017/0063071 A1* | 3/2017 | Yoneyama | H02H 3/08 |
| 2017/0272002 A1* | 9/2017 | Takahashi | H01L 29/1608 |
| 2018/0358903 A1* | 12/2018 | Takahashi | H05K 7/2089 |
| 2019/0096549 A1* | 3/2019 | Miyagawa | H01C 7/00 |
| 2020/0286864 A1* | 9/2020 | Horiguchi | H01L 25/072 |
| 2021/0127530 A1* | 4/2021 | Hozumi | H05K 7/1432 |
| 2021/0273575 A1* | 9/2021 | Kitahama | H01L 23/473 |

FOREIGN PATENT DOCUMENTS

| | | | | |
|---|---|---|---|---|
| JP | 2012-217322 A | 11/2012 | | |
| JP | 5733320 B2 | 6/2015 | | |
| WO | WO-2006119662 A2 * | 11/2006 | | H05K 1/141 |
| WO | WO-2013081097 A1 * | 6/2013 | | H05K 7/1432 |
| WO | WO-2018193621 A1 * | 10/2018 | | H01R 13/533 |
| WO | WO-2020003674 A1 * | 1/2020 | | G01R 15/207 |
| WO | WO-2020084691 A1 * | 4/2020 | | H01L 21/4842 |

* cited by examiner

*Primary Examiner* — Binh B Tran
*Assistant Examiner* — Muhammed Azam
(74) *Attorney, Agent, or Firm* — Sughrue Mion, PLLC; Richard C. Turner

(57) ABSTRACT

A capacitor and a discharge resistor can be connected using a simplified configuration without using a bus bar. A connection of a capacitor and a discharge resistor of a power conversion device are carried out using wire harnesses that form positive and negative lines. The capacitor and the discharge resistor are integrated by being directly connected using a first wire harness. A second wire harness is drawn out from a terminal portion electrically separated from a first terminal portion of the capacitor; and a third wire harness is drawn out from the discharge resistor, where the second wire harness and the third wire harness are fastened.

10 Claims, 7 Drawing Sheets

POWER CONVERSION DEVICE

BACKGROUND OF THE INVENTION

1. Field of the Invention

The present application relates to the field of a power conversion device.

2. Description of the Related Art

A power conversion device used in a hybrid car or an electric vehicle is configured so as to carry out power conversion between a vehicle-driving rotating electrical machine and a vehicle-mounted battery.

For example, when the rotating electrical machine is a three-phase alternating current rotating electrical machine, the power conversion device includes a power conversion circuit formed of a three-phase bridge circuit configured of six semiconductor switching elements. The three-phase bridge circuit is such that a direct current side terminal thereof is connected to an electrode terminal of the vehicle-mounted battery, and an alternating current side terminal is connected to a terminal of an armature winding of the rotating electrical machine.

When the rotating electrical machine is caused to operate as a motor for driving a vehicle, direct current power from the vehicle-mounted battery is converted into three-phase alternating current power by the power conversion device, and supplied to the rotating electrical machine. Meanwhile, when the rotating electrical machine is caused to operate as a generator, as when carrying out regenerative braking, three-phase alternating current power generated by the rotating electrical machine is converted into direct current power by the power conversion device, and supplied to the vehicle-mounted battery.

As is commonly known, the heretofore described power conversion device includes a smoothing capacitor connected between positive and negative direct current terminals of the power conversion circuit. Direct current power from the power conversion circuit is smoothed by the smoothing capacitor, which restricts a ripple generated even after rectification in a power supply circuit and smooths voltage so as to be closer to a direct current, and supplied to the vehicle-mounted battery. A capacitor of a comparatively large capacitance is used as the smoothing capacitor. For example, a resin-molded type capacitor, wherein a multiple of capacitor elements are connected in parallel using a bus bar, thereby increasing capacitance, and the capacitor elements are integrally sealed using a resin, may be used as the smoothing capacitor.

Also, a discharge resistor for causing a residual charge to be released is mounted in the power conversion device. By the discharge resistor being included, a charge remaining in a capacitor can be released via the discharge resistor even when the power conversion device is stopped, and an advantage is obtained in that the danger of electric shock when the vehicle collides or when carrying out maintenance, for example, is eliminated. The discharge resistor is directly connected to a capacitor, or connected via a terminal block.

An existing power conversion device is such that a capacitor and a discharge resistor are connected by a bus bar protruding from the discharge resistor being welded to the capacitor, and a discharge current of the capacitor is released by being caused to flow to the discharge resistor.

Further, heat generated in the discharge resistor is dissipated using a heatsink for dissipating heat from the discharge resistor and a passage that cools the heatsink (for example, refer to Patent Literature 1).

Also, technology whereby a short circuit is caused by wire leads extending individually from two elements being connected is disclosed in literature that discloses a heat discharging mechanism of another device (for example, refer to Patent Literature 2).

Patent Literature 1: JP A 2012-217322
Patent Literature 2: Japanese Patent No. 5,733,320

As the existing power conversion device disclosed in Patent Literature 1 is such that a capacitor and a discharge resistor are connected using a bus bar, the following kinds of problem exist. Firstly, in order to control a flow of heat generated in the discharge resistor so that the heat is not transferred to the capacitor via the bus bar, whose thermal resistance is smaller than that of a wire lead, the heat from the discharge resistor needs to be dissipated via a heatsink. Furthermore, there are cooling components such as the heatsink and a cooling passage that become necessary when utilizing a bus bar. Also, there is a need to enlarge a developed area of the bus bar in order to dissipate the heat generated by the discharge resistor. Because of this, there is a need to increase a part quantity, increase a volume of the bus bar used, render the cooling passage more complex, and secure a space in which to dispose the aforementioned members, because of which space conservation is difficult. Also, when connecting the bus bar protruding from the discharge resistor to a terminal block, welding is needed after mounting on a frame, and there is a problem in that manufacturing costs such as equipment costs increase.

Further, when a cooling component such as a heat sink is not used in a configuration wherein a capacitor and a discharge resistor are connected using a bus bar, there is a problem in that heat from the discharge resistor is transferred to the capacitor via the bus bar, and heat dissipation decreases.

SUMMARY OF THE INVENTION

The present application has been made to solve the problem, and an object of the present application is to provide a power conversion device such that a capacitor and a discharge resistor can be connected in a simplified form that does not use a bus bar, and heat dissipation can be improved.

A power conversion device disclosed in the present application includes a capacitor that is connected between positive and negative direct current terminals of a power conversion circuit and smooths a voltage, a discharge resistor into which a charge remaining in the capacitor is released, a first wire harness that is connected to a first terminal portion of the capacitor and connects the capacitor and the discharge resistor, a second wire harness drawn out from a second terminal portion electrically separated from the first terminal portion of the capacitor, and a third wire harness drawn out from the discharge resistor, in which the second wire harness and the third wire harness are fastened.

The power conversion device disclosed in the present application can achieve that both positive and negative wires are connected by a second wire harness and a third wire harness being coupled after a capacitor and a discharge resistor are integrated by being connected using a first wire harness, whereby a remaining charge can be released. As a wire harness, whose thermal resistance is greater than that of a bus bar, is used in the connection, heat from the discharge resistor is less likely to be transferred to the capacitor than when using a bus bar, and heat dissipation can be improved.

The foregoing and other objects, features, aspects, and advantages of the present application will become more apparent from the following detailed description of the present application when taken in conjunction with the accompanying drawings.

DETAILED DESCRIPTION OF THE PREFERRED EMBODIMENTS

First Embodiment

A power conversion device 100 according to a first embodiment of the present application will be described, using FIGS. 1 to 4. The power conversion device 100 includes a capacitor 1 (a smoothing capacitor or a resin-molded type capacitor) connected between positive and negative direct current terminals of a power conversion circuit, and a discharge resistor 2 into which a residual charge of the capacitor 1 is released, and positive electrode and negative electrode sides of the capacitor 1 and the discharge resistor 2 are connected using wire harnesses that form positive and negative lines.

Figure 1:
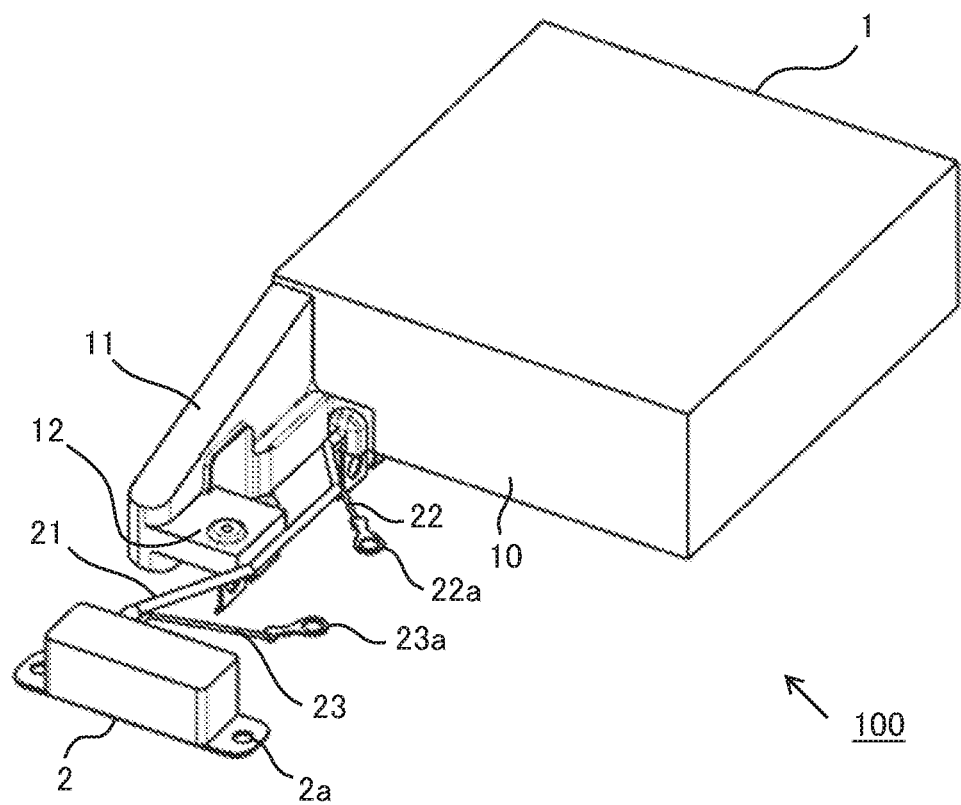
FIG. 1 is a perspective view showing an outline of a power conversion device according to a first embodiment.
Figure 2:
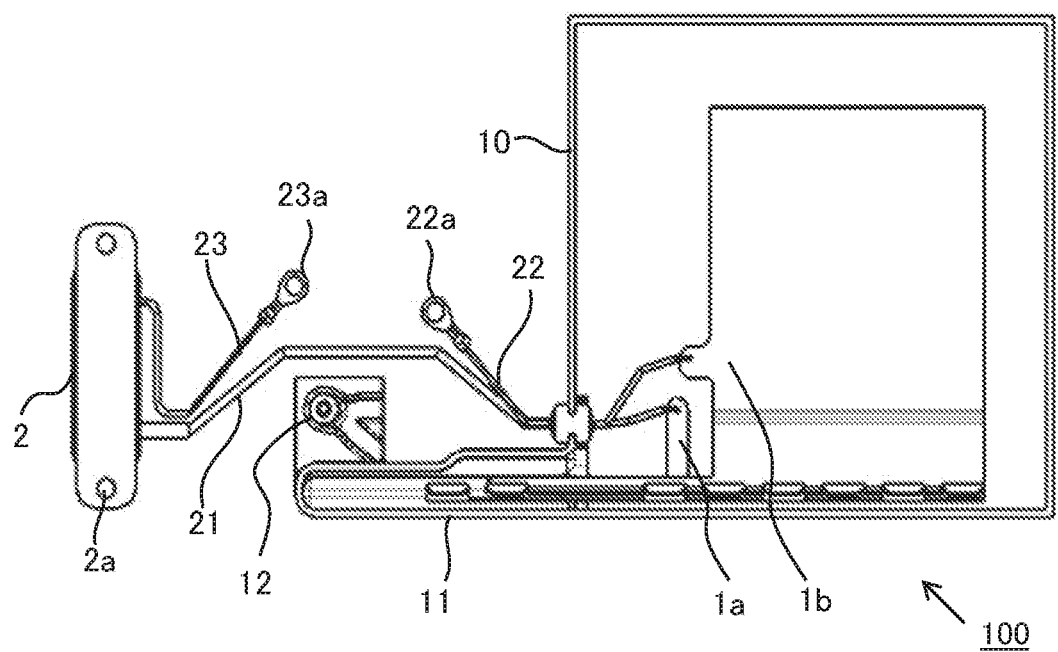
FIG. 2 is a bottom view observed from a back face side of the power conversion device of FIG. 1.
Figure 3:
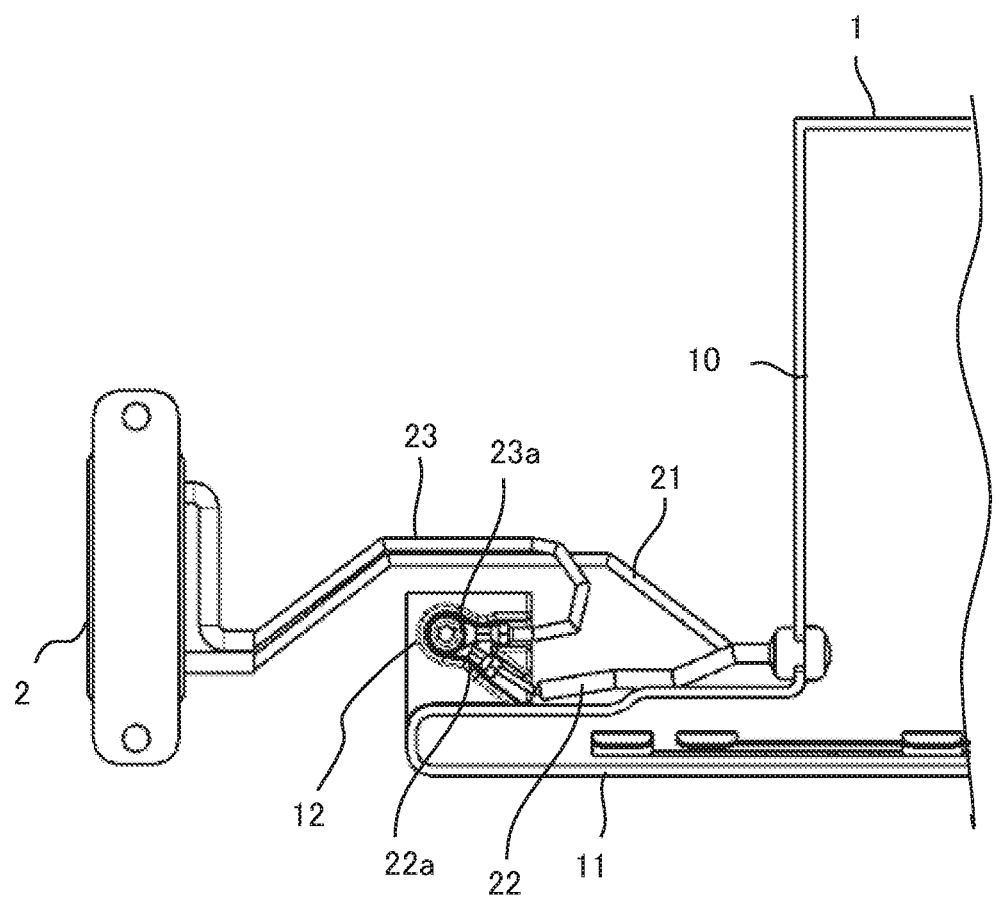
FIG. 3 is a main portion enlarged view of the power conversion device of FIG. 2.
Figure 4:
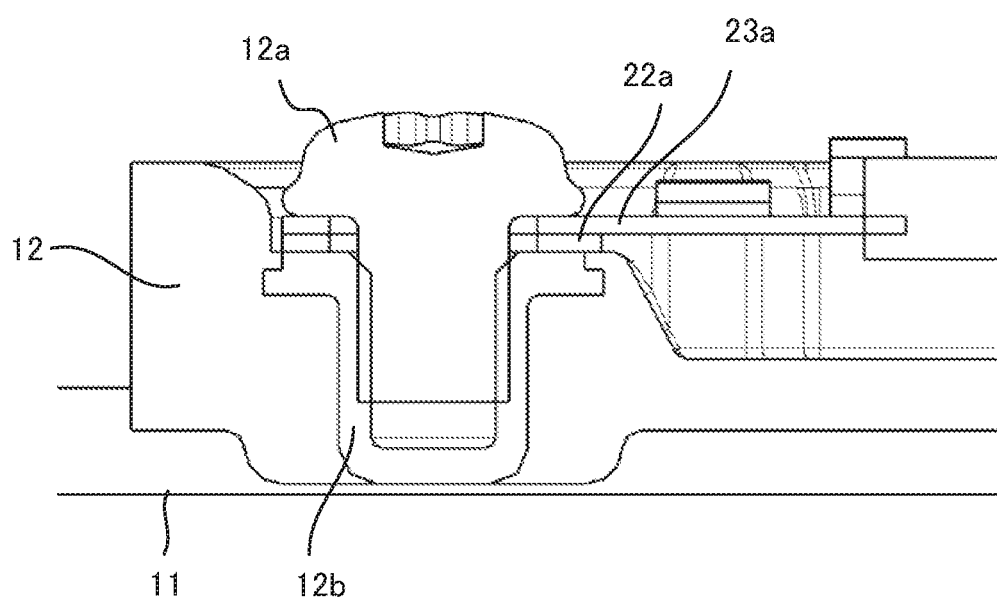
FIG. 4 is an enlarged sectional view of a fastening and fixing portion to which a crimp terminal is fixed.

FIG. 1 is a perspective view showing an outline of the power conversion device 100 according to the first embodiment, FIG. 2 is a bottom view observed from a back face side of the power conversion device 100 of FIG. 1, FIG. 3 is a main portion enlarged view of FIG. 2 showing a state wherein leading end portions of two wire harnesses are connected, and FIG. 4 is an enlarged sectional view of a fastening and fixing portion 12 to which two crimp terminals are fixed.

FIG. 1 is a perspective view showing an outline of the power conversion device 100 according to the first embodiment. The power conversion device 100 includes the capacitor 1, in which a capacitor main body is sealed in a resin, and the discharge resistor 2, and the capacitor 1 and the discharge resistor 2 are disposed separated from each other on an unshown base into which heat from the discharge resistor 2 is dissipated, and connected via wire harnesses that form positive and negative lines. An upper face and a side face of the capacitor 1 are covered by a housing 10, and a wall face portion 11 is extended laterally from one portion of a side face portion of the housing 10. The fastening and fixing portion 12, which forms a terminal block to which a wire harness leading end portion is fixed, is provided on one side face of the wall face portion 11, which is erected on the upper face of the unshown base.

One of the wire harnesses that form positive and negative lines is a first wire harness 21 that directly connects the capacitor 1 and the discharge resistor 2, and the other is applied by coupling a second wire harness 22 drawn out from the capacitor 1 and a third wire harness 23 drawn out from the discharge resistor 2. In the example of FIG. 1, the second wire harness 22 and the third wire harness 23 are shown in an unconnected state, but the wire harnesses are connected by fastening, or the like, using the fastening and fixing portion 12, as shown in FIG. 3 or the like, to be described hereafter.

A conductive portion is provided exposed in a leading end portion of the second wire harness 22 drawn out from the capacitor 1, in which a crimp terminal 22a, for example, is provided as the conductive portion. In the same way, a crimp terminal 23a is provided in a leading end portion of the third wire harness 23 drawn out from the discharge resistor 2.

As the fastening and fixing portion 12 is provided so as to be integrated with the wall face portion 11 extended from the housing 10 of the capacitor 1, a length of the second wire harness 22 drawn out from the capacitor 1 can be set to, for example, a length that provides leeway with respect to a distance between a position in the housing 10 from which the second wire harness 22 is drawn out and the fastening and fixing portion 12. Also, provided that a length of the third wire harness 23 disposed between the fastening and fixing portion 12 and the discharge resistor 2 is adjusted in accordance with a disposition of the discharge resistor 2, freedom of disposition of the discharge resistor 2 with respect to the capacitor 1 can be increased.

When the discharge resistor 2 is in a state mounted on the unshown base and short-circuited with respect to the capacitor 1 by the wire harnesses that form, the positive and negative lines, a residual charge of the capacitor 1 is released into the discharge resistor 2, and heat is generated. Heat generated in the discharge resistor 2 is dissipated into the base.

The discharge resistor 2 includes two projecting portions 2a protruding laterally from, for example, a main body portion bottom face, and the discharge resistor 2 can be mounted on an upper face of a base 3 by inserting a fastening screw or the like through a hole portion formed in the projecting portion 2a.

FIG. 2 is a bottom view observed from the back face side of the power conversion device 100 of FIG. 1, and shows a configuration at a stage before mounting on the base 3, to be described hereafter. In the example of FIG. 2, a first terminal portion 1a, which is one electrode inside the capacitor 1, and the first wire harness 21 are connected, and a second terminal portion 1b, which is another electrode inside the capacitor 1, and the second wire harness 22 are connected. When connection portions of the electrodes of the capacitor 1 and the first wire harness 21 and the second wire harness 22 are positioned inside a resin mold, as exemplified in FIG. 2, a stable state of connection between the electrodes and the wiring can be obtained. The electrodes and the wiring can also be connected outside the mold.

Herein, when the capacitor 1 sealed in a resin mold and the discharge resistor 2 are wire-connected by both the positive and negative lines, a smoothing capacitor characteristic inspection cannot be carried out normally. Therefore, the effect of the discharge resistor 2 is eliminated by disconnecting one wire, and a characteristic inspection of the capacitor 1 is carried out appropriately. Specifically, integration of the capacitor 1 and the discharge resistor 2 is achieved using the first wire harness 21, which forms the negative line, and a characteristic inspection of the capacitor 1 is implemented in a state wherein the second wire harness 22 and the third wire harness 23, which form the positive line, are not fastened. Because of this, a connection of the second wire harness 22 and the third wire harness 23 can be carried out after confirming the quality of the capacitor 1, whereby product quality can be stabilized.

When connecting the second wire harness 22 and the third wire harness 23, the second wire harness 22 and the third wire harness 23 are fastened and fixed to the fastening and fixing portion 12, which is a stand (terminal block) disposed on one side face of the wall face portion 11 extended from the housing 10. When doing so, the crimp terminal 22a in the leading end portion of the second wire harness 22 and the crimp terminal 23a in the leading end portion of the third wire harness 23 are positioned by being fitted into a groove portion provided in a surface of the fastening and fixing portion 12.

As exemplified in FIG. 4, a nut 12b is embedded so as to be exposed in a terminal mounting face of the fastening and fixing portion 12, and by the crimp terminals 22a and 23a being fastened and fixed using a fastening screw 12a in a state disposed one on the other on the nut 12b, the terminals can be electrically connected. As connection is carried out using the fastening screw 12a at this time, no welding operation for fastening is needed, and assembly can be carried out easily. Herein, in addition to the terminal mounting face of the fastening and fixing portion 12 being a back face side of a stand, as exemplified in FIGS. 2 and 3, the terminal mounting face can also be provided with another orientation, such as a front face side of a stand.

Herein, the groove portions for individually housing the crimp terminals 22a and 23a are provided so as to extend in differing directions in the fastening and fixing portion 12 extended from the housing 10 of the capacitor 1. By housing the crimp terminals 22a and 23a individually in the groove portions of the fastening and fixing portion 12, rotation of the crimp terminals 22a and 23a accompanying a rotation of the fastening screw 12a when fastening with the fastening screw 12a can be prevented.

Also, although a case wherein the crimp terminals 22a and 23a are provided in the wire harness leading end portions, which need an intermediate connection, is shown in the heretofore described example, it goes without saying that a form other than a crimp terminal can be adopted.

When the combination of a wire harness and a crimp terminal is changed to a wire harness and a connector, there is concern about an increase in cost due to a connector being used, or a semi-engagement of the connector, but by using a crimp terminal instead of a connector, advantages can be obtained in that cost is reduced, stability of fastening with the fastening screw increases, and the like.

The configuration of the power conversion device 100 according to the first embodiment is such that it is easy to provide a sufficient length of the first wire harness 21 and a sufficient total length of the coupled second wire harness 22 and third wire harness 23, and a distance between the capacitor 1 and the discharge resistor 2 can be sufficiently secured. Therefore, an effect of heat generated by the discharge resistor 2 to which the capacitor 1 is subjected via the wire harnesses (indicated by reference signs 21, 22, and 23) can be reduced.

In this way, according to the present application, the capacitor 1 and the discharge resistor 2 are connected using wire harnesses (21, 22, and 23), because of which current resistance and thermal resistance can be increased compared with when utilizing a bus bar, and a direction of heat dissipation can be regulated by restricting a reverse flow of heat from the discharge resistor 2 into the capacitor 1, thereby improving heat dissipation. Further, as the connection form is a simplified form wherein wire harnesses are utilized, advantages can also be obtained in that cost can be reduced and space can be conserved, carrying out a quality inspection in a state wherein two wire harnesses (22 and 23) are not fastened is easy, and stability of product quality increases.

Second Embodiment

Next, the power conversion device 100 according to a second embodiment will be described, using FIGS. 5 to 7. In the first embodiment, a case wherein the capacitor 1 and the discharge resistor 2 are disposed separated has been described, but in the second embodiment, a modification wherein the discharge resistor 2 can be fixed to the capacitor 1 will be described.

When a positional relationship between the capacitor 1 and the discharge resistor 2 is not fixed, ease of assembly is poor, and stable transportation is difficult, but the power conversion device 100 of the second embodiment, is such that discharge resistor holding portion 13 is provided by transforming one portion of the housing 10 of the capacitor 1, and the discharge resistor 2 is stably held, because of which ease of assembly and ease of transportation can be increased.

Figure 5:
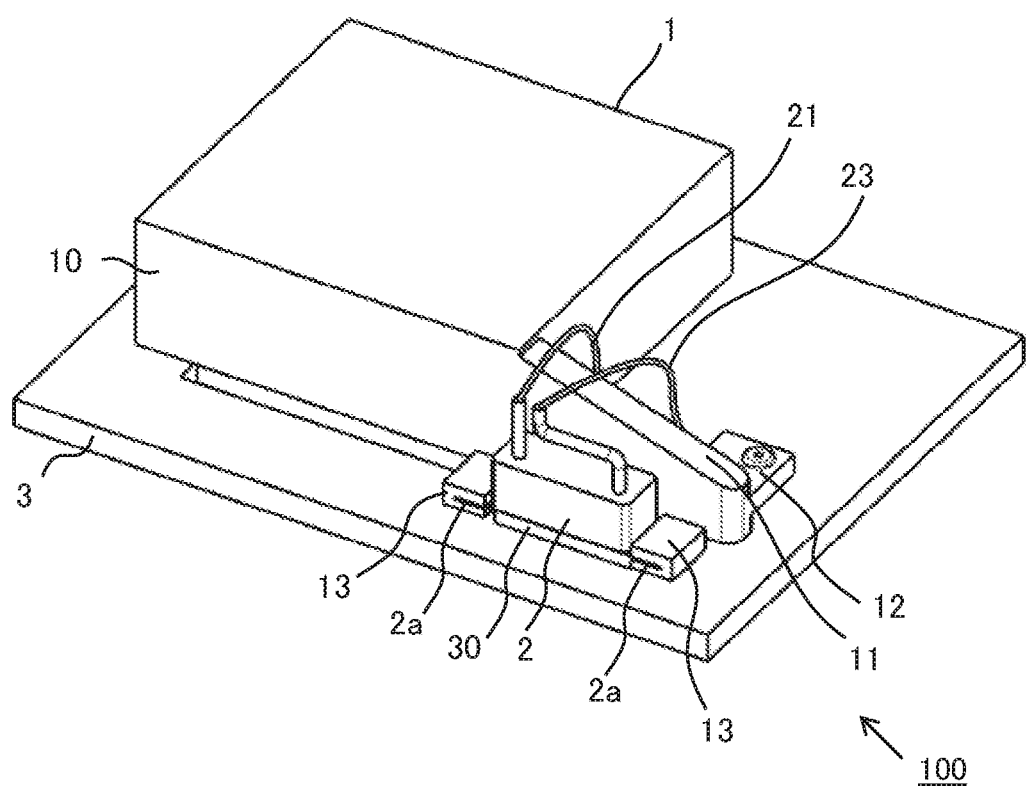
FIG. 5 is a perspective view showing an outline of the power conversion device according to a second embodiment.
Figure 6:
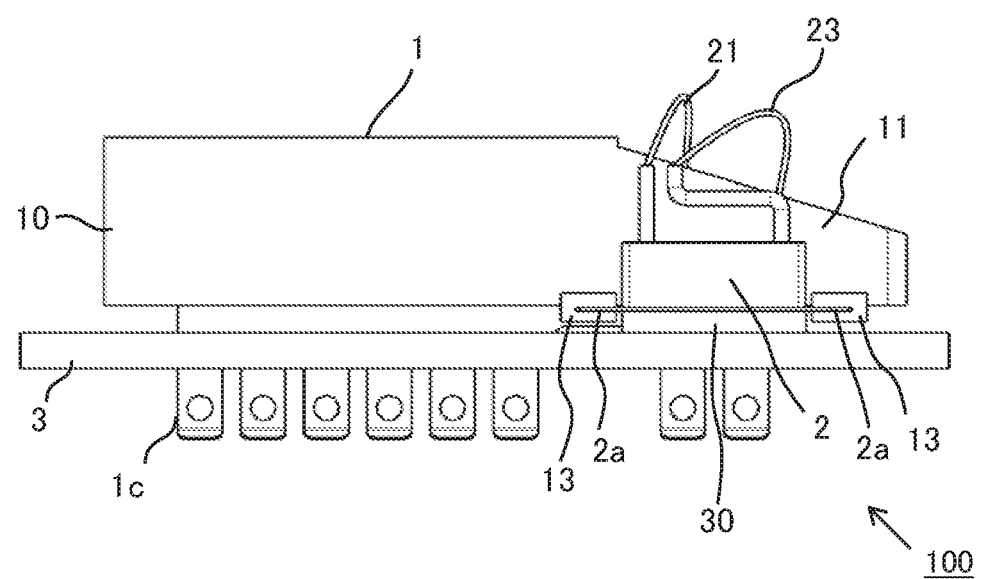
FIG. 6 is a side view of the power conversion device of FIG. 5.
Figure 7:
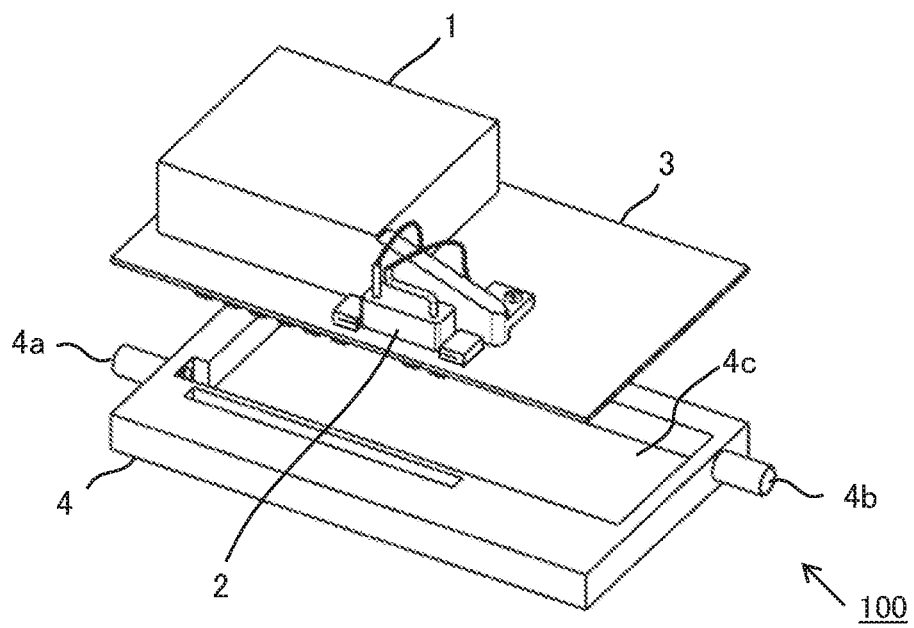
FIG. 7 is an exploded perspective view of the power conversion device including a cooling channel.

FIG. 5 is a perspective view showing an outline of the power conversion device 100 according to the second embodiment, FIG. 6 is a side view of the power conversion device 100 of FIG. 5, and FIG. 7 is an exploded perspective view of the power conversion device 100 including a water jacket 4 as a cooling channel component.

As shown in FIGS. 5 and 6, the power conversion device 100 of the second embodiment is such that the fastening and fixing portion 12, to which the second wire harness 22 and the third wire harness 23 are fastened and fixed, is provided on one side face of the wall face portion 11 extended from the housing 10 of the capacitor 1, and the discharge resistor holding portion 13, to which the discharge resistor 2 is fixed, is provided on the other side face of the wall face portion 11.

The discharge resistor holding portion 13 includes, for example, groove-form fitting portions into which the two projecting portions 2a protruding laterally (protruding in opposite directions) from the main body portion bottom face of the discharge resistor 2 are fitted. By inserting the projecting portions 2a of the discharge resistor 2 in the fitting portions of the discharge resistor holding portion 13, the discharge resistor 2 can be integrated with the capacitor 1 and held.

A heat dissipating sheet 30 is interposed between the bottom face of the discharge resistor 2 held is the discharge resistor holding portion 13 and the upper face of the base 3, thereby facilitating dissipation of heat from the discharge resistor 2 to the base 3. By the heat dissipating sheet 30 being disposed on the upper face of the base 3, the heat dissipating sheet 30 can be brought into a state of contact with the bottom face of the discharge resistor 2 simultaneously with the capacitor 1 with which the discharge resistor 2 is integrated being installed on the base 3. Further, by the heat dissipating sheet 30 being interposed between the discharge resistor 2 and the base 3, an allowance between the discharge resistor 2 and the base 3 can be absorbed.

Herein, the first wire harness 21 drawn out from the capacitor 1 and the third wire harness 23 extended from the fastening and fixing portion 12 are each disposed in a form passing over an upper portion of the wall face portion 11 to reach the discharge resistor 2, and a wire length greater than that of a linear form by a length of a looped portion can be secured, whereby heat from the discharge resistor 2 being transmitted to the capacitor 1 side via the wires is restricted.

As shown in FIG. 6, a terminal portion 1*c* for connecting to another part such as a power module or a reactor is exposed, passing through the base 3, on a lower face side of the capacitor 1.

Also, there is a case wherein the first wire harness 21 and the third wire harness 23 are bound together using a cable tie, and a protective film is provided with an object of protecting the wires in a portion in which the cable tie is disposed.

Also, as shown in FIG. 7, a cooling channel is provided on a back face side of the base 3 opposite to the face on which the capacitor 1 is installed. A recessed portion that forms a cooling passage 4*c*, a cooling water inflow port 4*a* for causing cooling water to flow into the cooling passage 4*c*, and a cooling water outflow port 4*b* for discharging cooling water in the cooling passage 4*c* to the exterior, are included in the water jacket 4 configuring the cooling channel. Inflow and outflow directions of the cooling water may be opposite directions.

It goes without saying that heat dissipation improves by the cooling passage 4*c* being disposed directly below the discharge resistor 2.

According to the power conversion device 100 having the heretofore described configuration, assembly and transportation are facilitated by the discharge resistor 2 being integrated with the housing 10 of the capacitor 1, in addition to which fastening members, such as screws, for installing the discharge resistor 2 can be reduced, and space conservation can be realized. Further, heat is actively transmitted to the base 3 by the heat dissipating sheet 30 being included, whereby heat dissipation can be improved, and an allowance between the discharge resistor 2 and the base 3 can be absorbed.

Although the present disclosure is described above in terms of various exemplifying embodiments, it should be understood that the various features, aspects, and functions described in one or more of the individual embodiments are not limited in their applicability to the particular embodiment with which they are described, but instead can be applied, alone or in various combinations, to one or more of the embodiments.

It is therefore understood that numerous modifications that have not been exemplified can be devised without departing from the scope of the present application. For example, at least one of the constituent components may be modified, added, or omitted.

What is claimed is:

1. A power conversion device, comprising:
   a capacitor that is connected between positive and negative direct current terminals of a power conversion circuit and smooths a voltage;
   a discharge resistor into which a charge remaining in the capacitor is released;
   a first wire harness that is connected to a first terminal portion of the capacitor and connects the capacitor and the discharge resistor;
   a second wire harness drawn out from a second terminal portion electrically separated from the first terminal portion of the capacitor; and
   a third wire harness drawn out from the discharge resistor, wherein
   the second wire harness and the third wire harness are fastened.

2. The power conversion device according to claim 1, wherein the first wire harness is connected to a negative electrode side of the capacitor, and the second wire harness is connected to a positive electrode side of the capacitor.

3. The power conversion device according to claim 1, wherein a crimp terminal is provided in a leading end portion of one or both of the second wire harness and the third wire harness, and the second wire harness and the third wire harness are fastened via the crimp terminal.

4. The power conversion device according to claim 1, wherein a fastening and fixing portion forming a stand to which the leading end portion of the second wire harness and a leading end portion of the third wire harness are fastened and fixed is provided extending from one portion of a housing in which the capacitor is housed, on an outer side of the housing, and the leading end portion of the second wire harness and the leading end portion of the third wire harness are fixed to the fastening and fixing portion using a fastening screw.

5. The power conversion device according to claim 4, wherein groove portions in which the leading end portion of the second wire harness and the leading end portion of the third wire harness are housed are provided in the fastening and fixing portion.

6. The power conversion device according to claim 4, wherein a wall face portion erected on an upper face of a base on which the capacitor is installed is provided extending from the one portion of the housing in which the capacitor is housed, the fastening and fixing portion is disposed on one side face of the wall face portion, and the discharge resistor is disposed on another side face of the wall face portion.

7. The power conversion device according to claim 6, wherein the first wire harness and the third wire harness are disposed in a form passing over an upper portion of the wall face portion.

8. The power conversion device according to claim 6, wherein a discharge resistor holding portion that holds the discharge resistor is provided extending from the other side face of the wall face portion.

9. The power conversion device according to claim 8, wherein a heat dissipating sheet is disposed between a bottom face of the discharge resistor held in the discharge resistor holding portion and the upper face of the base on which the capacitor is installed.

10. The power conversion device according to claim 9, wherein a cooling channel is disposed on a back face side of the base.

* * * * *